(12) United States Patent
Yi et al.

(10) Patent No.: US 9,608,013 B2
(45) Date of Patent: Mar. 28, 2017

(54) ARRAY SUBSTRATE, LIQUID CRYSTAL PANEL, AND MANUFACTURING METHOD OF ARRAY SUBSTRATE

(71) Applicant: SHENZHEN CHINA STAR OPTOELECTRONICS TECHNOLOGY CO., LTD., Guangdong (CN)

(72) Inventors: Zhiguang Yi, Guangdong (CN); Zhicheng Liu, Guangdong (CN)

(73) Assignee: SHENZHEN CHINA STAR OTPOELECTRONICS TECHNOLOGY CO., LTD., Shenzhen (CN)

( * ) Notice: Subject to any disclaimer, the term of this patent is extended or adjusted under 35 U.S.C. 154(b) by 147 days.

(21) Appl. No.: 14/235,455

(22) PCT Filed: Jan. 9, 2014

(86) PCT No.: PCT/CN2014/070356
§ 371 (c)(1),
(2) Date: Jan. 28, 2014

(87) PCT Pub. No.: WO2015/089923
PCT Pub. Date: Jun. 25, 2015

(65) Prior Publication Data
US 2015/0279867 A1    Oct. 1, 2015

(30) Foreign Application Priority Data

Dec. 16, 2013  (CN) .......................... 2013 1 0693039

(51) Int. Cl.
*G02F 1/1333*  (2006.01)
*H01L 27/12*  (2006.01)
*G02F 1/1362*  (2006.01)

(52) U.S. Cl.
CPC .... *H01L 27/1244* (2013.01); *G02F 1/136204* (2013.01); *G02F 1/136286* (2013.01); *H01L 27/1259* (2013.01)

(58) Field of Classification Search
CPC ............. H01L 27/1244; H01L 27/1259; G02F 1/136204

(Continued)

(56) References Cited

U.S. PATENT DOCUMENTS 5,671,026 A * 9/1997 Shiraki ............... G02F 1/13454
257/356
6,365,303 B1 * 4/2002 Hung ..................... G03F 1/144
257/355

(Continued)

FOREIGN PATENT DOCUMENTS

CN         103123428 A    5/2013
TW         I231159 B      4/2005

OTHER PUBLICATIONS

1st Office Action of counterpart Chinese Patent Application No. 201310693039.1 issued on Aug. 24, 2015.

*Primary Examiner* — David Vu
*Assistant Examiner* — Brandon Fox

(57) ABSTRACT

The present disclosure provides an array substrate, a liquid crystal panel, and a manufacturing method of the array substrate. In the present disclosure, the first discharging elements and the second discharging elements are arranged on the array substrate, the first discharging elements are electrically connected to the common electrode line, and the second discharging elements are respectively electrically connected to the data lines, and the first discharging elements and the second discharging elements are simultaneously formed with the scanning lines and the data lines or are formed after the scanning lines and the data lines are formed, thus, electrostatic protection is provided to the components (Continued)

in the subsequent manufacturing process of the array substrate after the scanning line and the data lines are formed on the array substrate.

10 Claims, 3 Drawing Sheets

(58) Field of Classification Search
    USPC .......................................................... 349/40
    See application file for complete search history.

(56) References Cited

U.S. PATENT DOCUMENTS

| | | | |
|---|---|---|---|
| 8,334,959 B2 * | 12/2012 | Hirabayashi ...... | G02F 1/136204 345/104 |
| 2007/0096214 A1 * | 5/2007 | Chen ................... | H01L 27/0285 257/355 |
| 2009/0084938 A1 * | 4/2009 | Okada ............... | H01L 27/14676 250/208.1 |
| 2010/0277879 A1 * | 11/2010 | Juan ..................... | G06F 1/1656 361/753 |

* cited by examiner

ARRAY SUBSTRATE, LIQUID CRYSTAL PANEL, AND MANUFACTURING METHOD OF ARRAY SUBSTRATE

BACKGROUND

1. Technical Field

The present disclosure generally relates to technologies of liquid displays, and more particularly, to an array substrate, a liquid crystal panel, and a manufacturing method of an array substrate.

2. Description of Related Art

Displays become indispensable in people's daily life. Types of the displays include CRT (Cathode Ray Tube), LED (Light Emitting Diode), TFT-LCD (Thin Film Transistor-Liquid Crystal Display), PDP (Plasma Display Panel), etc. At present, most of the displays in the market are TFT-LCD displays.

A TFT-LCD display includes an array substrate, a color film substrate, and a liquid crystal layer arranged between the array substrate and the color film substrate. The display can be controlled by controlling a voltage applied to the liquid crystal layer. In the manufacturing process of the TFT-LCD display (for example, in the manufacturing process of the array substrate of the TFT-LCD display), static electricity is easily generated to burn out some components (for example, conductive wires or switches) and to reduce the yield rate of the product.

FIG. 1 shows an ESD (Electro-Static discharge) protector 10 commonly used in the array substrate. The process of forming the ESD protector 10 is as follows: forming a gate electrode 101, a semiconductor layer 102 and a SE layer 103, and an insulation layer in this order; defining holes 104; and short circuiting the gate electrode 101 and the SE layer 103 via a transparent layer (Indium Tin Oxide) 105, thereby simultaneously forming two back-to-back TFTs, that is, the ESD protector 10, with the array substrate. Referring to FIG. 2, in the array substrate, the ESD protector 10 conducts a current generated by the array substrate to a Com (Common) electrode 30 to provide electrostatic protection to the array substrate after all the manufacturing process of the array substrate is finished.

However, the ESD protector 10 shown in FIGS. 1 and 2 works after the manufacturing process of the array substrate is finished and cannot provide electrostatic protection to the components of the display during the manufacturing process of the array substrate, thus, the ESD protector 20 cannot solve the problem that the yield rate of the product of is reduced by burnouts of the components due to static electricity.

SUMMARY

The main object of the present disclosure is to provide an array substrate, a liquid crystal panel, and a manufacturing method of the array substrate, for providing electrostatic protection to components of the array substrate in the manufacturing process of the array substrate after scanning lines and data lines are formed, avoiding the problem that a yield rate of the product is reduced by burnouts of the components of the array substrate due to static electricity, improving the yield rate and thus reducing the manufacturing cost.

The arrays substrate provided in the present disclosure including:
a display area;
a plurality of scanning lines and data lines arranged on the display area as a matrix;
a common electrode line arranged at an edge of the display area and surrounding the display area;
at least one first discharging element electrically connected to the common electrode line; and
at least one second discharging element arranged opposite to the at least one first discharging element and electrically connected to the corresponding data line.

Preferably, a cross-sectional area of an end of each first discharging element adjacent to the corresponding second discharging element is smaller than that of the other end of the first discharging element, and a cross-sectional area of an end of each second discharging element adjacent to the corresponding first discharging element is smaller than that of the other end of the second discharging element.

Preferably, an end of each first discharging element adjacent to the corresponding second discharging element is formed as a tip, and an end of each second discharging element adjacent to the corresponding first discharging element is also formed as a tip.

Preferably, a discharging gap is defined between each first discharging element and the corresponding second discharging element.

Preferably, a width of the gap is 10 um.

Preferably, the array substrate further includes a non-display area surrounding the display area, and the at least one first discharging element and the at least one second discharging element are arranged on the non-display area.

Preferably, each data line is provided a leading-out wire, and the leading-out wire is electrically connected to the corresponding second discharging element.

The liquid crystal panel provided in the present disclosure includes the above array substrate, a color film substrate, and a liquid crystal layer arranged between the array substrate and the color film substrate.

The manufacturing method of the array substrate provided in the present disclosure, including:
providing a substrate including a display area, a plurality of scanning lines and data lines arranged on the display area as a matrix, and a common electrode line arranged on an edge of the display area and surrounding the display area; and
forming at least one first discharging element and at least one second discharging element opposite to the at least one first discharging element on the substrate, the at least one first discharging element being electrically connected to the common electrode line, and the at least one second discharging element being electrically connected to the corresponding data line.

Preferably, a cross-sectional area of an end of each first discharging element adjacent to the corresponding second discharging element is smaller than that of the other end of the first discharging element, and a cross-sectional area of an end of each second discharging element adjacent to the corresponding first discharging element is smaller than that of the other end of the second discharging element.

Preferably, the at least one first discharging element is simultaneously formed with the scanning lines, and the at least one second discharging element is simultaneously formed with the data lines.

Preferably, an end of each first discharging element adjacent to the corresponding second discharging element is formed as a tip, and an end of each second discharging element adjacent to the corresponding first discharging element is also formed as a tip.

The first discharging elements and the second discharging elements are arranged on the array substrate, the first discharging elements are electrically connected to the common electrode line, the second discharging elements are respectively electrically connected to the data lines, and the first discharging elements and the second discharging elements are simultaneously formed with the scanning lines and the data lines or are formed after the scanning lines and the data lines are formed, thus, the first discharging elements and the second discharging elements can provide electrostatic protection to the components in the subsequent manufacturing process of the array substrate, to avoid the problem that the yield rate of the product is reduced by the burnouts of some components due to static electricity, improve the yield rate of the product, and reduce the manufacturing cost of the product.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
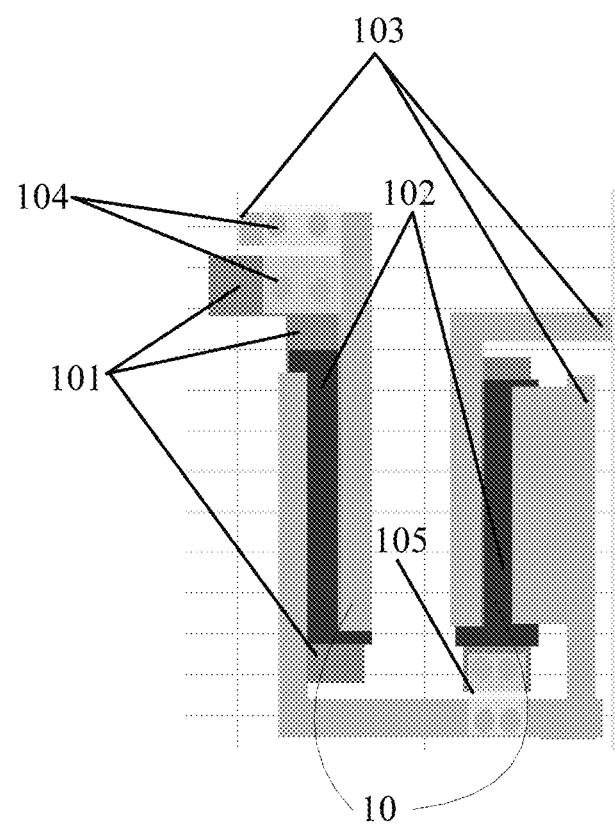
FIG. 1 is a schematic view of a conventional electrostatic protection device used in an array substrate.
Figure 2:
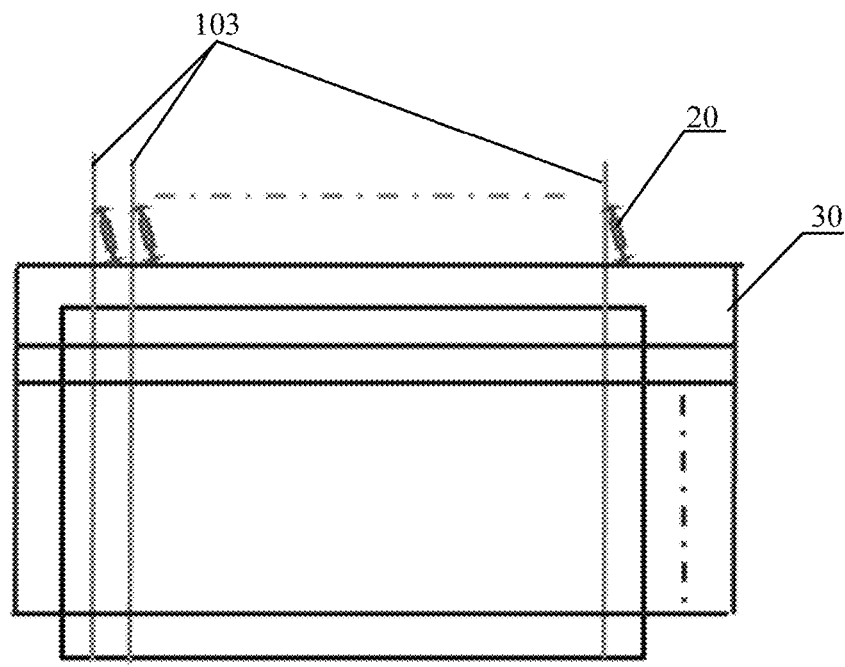
FIG. 2 is a schematic view of a conventional electrostatic protection circuit used in an array substrate.
Figure 3:
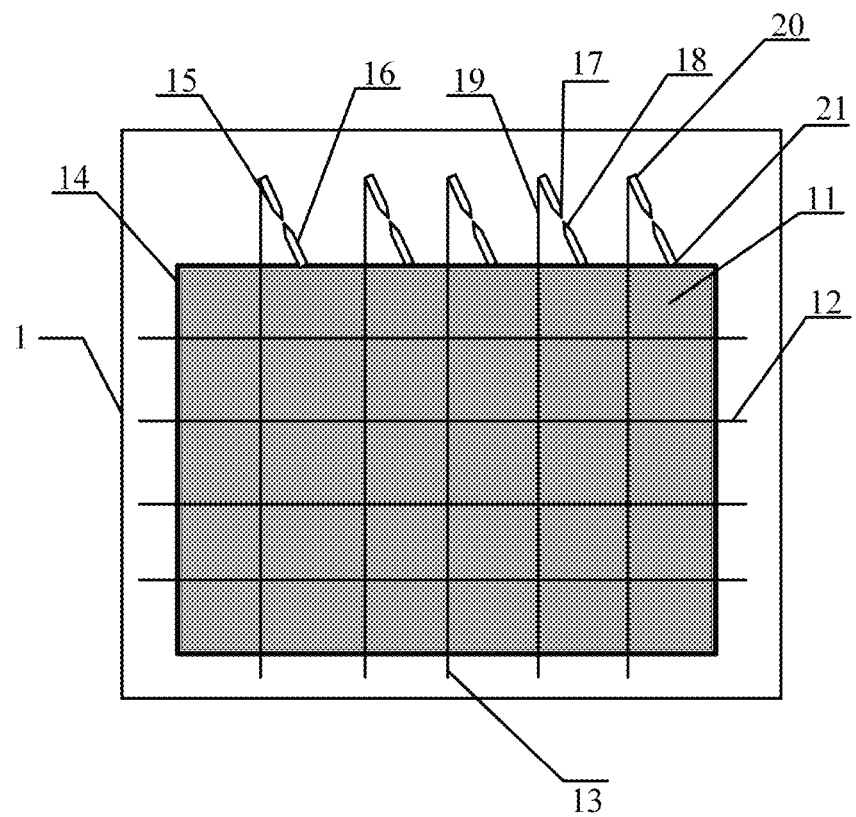
FIG. 3 is a schematic view of an array substrate in accordance with an embodiment of the present disclosure.

Referring to FIG. 3, an array substrate 1 provided in the present disclosure includes a display area 11, a plurality of scanning lines 12 and data lines 13 arranged on the display area 11 as a matrix, a common electrode line 14 arranged on an edge of the display area 11 and surrounding the display area 11, at least one first discharging element 16, and at least one second discharging element 15 opposite to the at least one first discharging element 15. The at least one first discharging element 16 is electrically connected to the common electrode line 14, and the at least one second discharging element 15 is electrically connected to the corresponding data line 13.

In the embodiment, the array substrate 1 includes a plurality of scanning lines 12 and data lines 13 formed as a matrix, a plurality of first discharging elements 16, and a plurality of second discharging elements 15 opposite to the first discharging elements 16. The first discharging elements 16 are electrically connected to the common electrode line 14, and the second discharging elements 15 are respectively electrically connected to the data lines 13. In order to simplify the manufacturing process of the array substrate 1, the first discharging elements 16 are simultaneously formed with the scanning lines 12, and the second discharging elements 15 are simultaneously formed with the data lines 13. In other embodiments, the first discharging elements 16 and the second discharging elements 15 can also be formed after the scanning lines 12 and the data lines 13 are formed.

In order to provide electrostatic protection in the manufacturing process of the array substrate 1 and protect components of the array substrate 1, a cross-sectional area of a first end 17 of each first discharging element 16 adjacent to the corresponding second discharging element 15 is smaller than that of the other end 20 of the first discharging element 16, and a cross-sectional area of an end 18 of each second discharging element 15 adjacent to the corresponding first discharging element 16 is smaller than that of the other end 21 of the second discharging element 15.

In the embodiment, the first discharging elements 16 and the second discharging elements 15 are arranged on the array substrate 1, and the first discharging elements 16 are electrically connected to the common electrode line 14, and the second discharging elements 15 are respectively electrically connected to the data lines 13. By simultaneously forming the first discharging elements 16 and the second discharging elements 15 with the scanning lines 12 and the data lines 13, or forming the first discharging elements 16 and the second discharging elements 15 after the scanning lines 12 and the data lines 13 are formed, the first discharging elements 16 and the second discharging elements 15 can provide electrostatic protection to the components in the subsequent manufacturing process of the array substrate 1, to avoid the problem that the yield rate of the product is reduced by the burnouts of some components due to static electricity, improve the yield rate of the product, and reduce the manufacturing cost of the product.

Furthermore, in order to provide better electrostatic protection in the manufacturing process of the array substrate 1 and avoid the burning outs of the components of the array substrate caused by static electricity, the end 17 of each first discharging element 16 adjacent to the corresponding second discharging element 15 is formed as a tip, the end 18 of each second discharging element 15 adjacent to the corresponding first discharging element 16 is also formed as a tip.

Furthermore, in order to better discharge the static electricity generated in the manufacturing process of the array substrate 1, a discharging gap having a width being 10 um is defined between each first discharging element 16 and the corresponding second discharging element 15. In other embodiments, the discharging gap can be a gap with a suitable width for better discharging the static electricity generated in the manufacturing process of the array substrate 1.

Furthermore, in order to ensure that a display having the array substrate 1 has a better displaying effect, the array substrate 1 further includes a non-display area 11 surrounding the display area 11. The first discharging elements 16 and the second discharging elements 15 are all arranged on the non-display area. Each data line 13 is provided with a leading-out wire 19 arranged on the non-display area and electrically connected to the corresponding second discharging element 15.

The present disclosure further provides a liquid crystal panel including the above array substrate, a color film substrate, and a liquid crystal layer arranged between the array substrate and the color film substrate. The detailed structure of the array substrate is as described above, which is not given in detail here.

Figure 4:
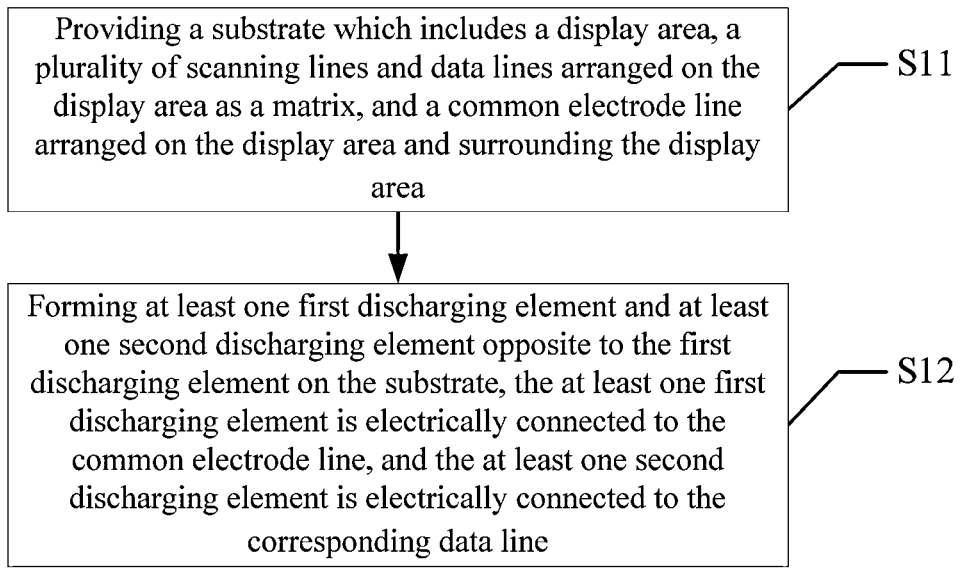
FIG. 4 is a flow chart of a manufacturing method of the array substrate in accordance with an embodiment of the present disclosure.

As shown in FIG. 4, the present disclosure further provides a manufacturing method of an array substrate, including the following steps:

a step S11, providing a substrate which includes a display area, a plurality of scanning lines and data lines arranged on the display area as a matrix, and a common electrode line arranged on the display area and surrounding the display area; and a step S12, forming at least one first discharging element and at least one second discharging element opposite to the at least one first discharging element on the substrate, the at least one first discharging element is electrically connected to the common electrode line, and the at least one second discharging element is electrically connected to the corresponding data line.

Specifically, in the embodiment, the array substrate includes a plurality of scanning lines and data lines formed as a matrix, a plurality of first discharging elements and a plurality of second discharging elements opposite to the first discharging elements. The first discharging elements are electrically connected to the common electrode line, and the second discharging elements are respectively electrically connected to the data lines. In order to simplify the manufacturing process of the array substrate, the first discharging elements are simultaneously formed with the scanning lines, and the second discharging elements are simultaneously formed with the data lines. In other embodiments, the first discharging elements and the second discharging elements can also be formed after the scanning lines and the data lines are formed.

Taking that the first discharging elements are simultaneously formed with the scanning lines and the second discharging elements are simultaneously formed with the data lines as an example, the process of forming the scanning lines on the substrate is as follows: coating conductive material and a photoresist on the substrate, irradiating special areas of the substrate with the conductive material and the photo-resist coated thereon in sequence with a special photomask, that is, exposing the substrate with the conductive material and the photoresist coated thereon in sequence; developing the exposed substrate to form the scanning lines and the data lines as a matrix, the first discharging elements electrically connected to the common electrode line, and the second discharging elements respectively electrically connected to the data lines on the substrate. The special photomask is opened at special positions according to the property of the photoresist. If the photoresist is a negative photoresist, the part of the photoresist which corresponds to the opened area of the photomask and is exposed to the ultraviolet light is not developed. If the photoresist is a positive photoresist, the part of the photoresist which corresponds to the opened area and is exposed to the ultraviolet light is developed.

In the embodiment, the process of forming the scanning lines and the first discharging elements is as follows: opening the photomask at positions corresponding to the scanning lines and the first discharging elements if the photoresist is a negative photoresist, otherwise opening the photomask at positions which do not correspond to the scanning lines and the first discharging elements if the photoresist is a positive photoresist, and thereafter forming the scanning lines and the first discharging lines according to the above method. The process of forming the data lines and the second discharging elements is as follows: opening the photomask at positions corresponding to the data lines and the second discharging elements if the photoresist is a negative photoresist, otherwise opening the photomask at positions which do not correspond to the data lines and the second discharging elements if the photoresist is a positive photoresist, and thereafter forming the data lines and the second discharging elements according to the above method.

In the embodiment, the first discharging elements and the second discharging elements are arranged on the array substrate, the first discharging elements are electrically connected to the common electrode line, and the second discharging elements are respectively electrically connected to the data lines, and the first discharging elements and the second discharging elements are simultaneously formed with the scanning lines and the data lines or are formed after the scanning lines and the data lines are formed, thus, electrostatic protection is provided to the components in the subsequent manufacturing process of the array substrate after the scanning lines and the data lines are formed on the array substrate. This effectively avoids the problem that the yield rate of the product is reduced by the burnouts of some components due to static electricity, improves the yield rate, and reduces the manufacturing cost.

Furthermore, in order to provide better electrostatic protection in the manufacturing process of the array substrate and avoid the burnouts of the components of the array substrate caused by static electricity, an end of each first discharging element adjacent to the corresponding second discharging element is formed as a tip, and an end of each second discharging element adjacent to the corresponding first discharging element is also formed as a tip.

Furthermore, in order to better discharge the static electricity generated in the manufacturing process of the array substrate, a discharging gap having a width being 10 um is defined between each first discharging element and the corresponding second discharging element. In other embodiments, the discharging gap can be a gap with a suitable width for better discharging the static electricity generated in the manufacturing process of the array substrate.

Furthermore, in order to ensure that a display having the array substrate has a better displaying effect, the array substrate further includes a non-display area surrounding the display area. The first discharging elements and the second discharging elements are all arranged on the non-display area. Each data line is provided with a leading-out wire which is arranged on the non-display area and is electrically connected to the corresponding second discharging element.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. An array substrate, comprising:
a display area;
a plurality of scanning lines and data lines arranged on the display area as a matrix;
a common electrode line arranged at an edge of the display area and surrounding the display area;
at least one first discharging element electrically connected to the common electrode line and simultaneously formed with the scanning lines; and
at least one second discharging element arranged opposite to the at least one first discharging element, electrically connected to the corresponding data line and simultaneously formed with the data lines;

wherein a discharging gap is defined between each first discharging element and the corresponding second discharging element, and a width of the gap is 10 um.

2. The array substrate of claim 1, wherein a cross-sectional area of an end of each first discharging element adjacent to the corresponding second discharging element is smaller than that of the other end of the first discharging element, and a cross-sectional area of an end of each second discharging element adjacent to the corresponding first discharging element is smaller than that of the other end of the second discharging element.

3. The array substrate of claim 1, wherein an end of each first discharging element adjacent to the corresponding second discharging element is formed as a tip, and an end of each second discharging element adjacent to the corresponding first discharging element is also formed as a tip.

4. The array substrate of claim 3 further comprising a non-display area surrounding the display area, and the at least one first discharging element and the at least one second discharging element are arranged on the non-display area.

5. The array substrate of claim 4, wherein each data line is provided a leading-out wire, and the leading-out wire is electrically connected to the corresponding second discharging element.

6. The array substrate of claim 1 further comprising a non-display area surrounding the display area, and the at least one first discharging element and the at least one second discharging element are arranged on the non-display area.

7. The array substrate of claim 6, wherein each data line is provided a leading-out wire, and the leading-out wire is electrically connected to the corresponding second discharging element.

8. A liquid crystal panel comprising an array substrate, a color film substrate, and a liquid crystal layer arranged between the array substrate and the color film substrate; wherein the array substrate comprises:
  a display area;
  a plurality of scanning lines and data lines arranged on the display area as a matrix;
  a common electrode line arranged at an edge of the display area and surrounding the display area;
  at least one first discharging element electrically connected to the common electrode line and simultaneously formed with the scanning lines; and
  at least one second discharging element arranged opposite to the at least one first discharging element, electrically connected to the corresponding data line and simultaneously formed with the data lines;
wherein a discharging gap is defined between each first discharging element and the corresponding second discharging element, and a width of the gap is 10 um.

9. The liquid crystal panel of claim 8, wherein a cross-sectional area of an end of each first discharging element adjacent to the corresponding second discharging element is smaller than that of the other end of the first discharging element, and a cross-sectional area of an end of each second discharging element adjacent to the corresponding first discharging element is smaller than that of the other end of the second discharging element.

10. The liquid crystal panel of claim 8, wherein an end of each first discharging element adjacent to the corresponding second discharging element is formed as a tip, and an end of each second discharging element adjacent to the corresponding first discharging element is also formed as a tip.

* * * * *

UNITED STATES PATENT AND TRADEMARK OFFICE
CERTIFICATE OF CORRECTION

PATENT NO. : 9,608,013 B2  
APPLICATION NO. : 14/235455  
DATED : March 28, 2017  
INVENTOR(S) : Zhiguang Yi and Zhicheng Liu Page 1 of 1

It is certified that error appears in the above-identified patent and that said Letters Patent is hereby corrected as shown below:

On the Title Page

Item (73), Assignee should read:
"SHENZHEN CHINA STAR OPTOELECTRONICS TECHNOLOGY CO., LTD."

Signed and Sealed this
Thirtieth Day of May, 2017

Michelle K. Lee
*Director of the United States Patent and Trademark Office*